(12) United States Patent
Hsu et al.

(10) Patent No.: US 9,287,306 B2
(45) Date of Patent: Mar. 15, 2016

(54) PRODUCTION APPARATUS FOR MANUFACTURING SENSOR PACKAGE STRUCTURE

(71) Applicant: AZUREWAVE TECHNOLOGIES, INC., New Taipei (TW)

(72) Inventors: Chi-Hsing Hsu, New Taipei (TW); Ching-Wei Liu, Taoyuan County (TW); Chun-Yu Lu, New Taipei (TW)

(73) Assignee: AZUREWAVE TECHNOLOGIES, INC., New Taipei (TW)

( * ) Notice: Subject to any disclaimer, the term of this patent is extended or adjusted under 35 U.S.C. 154(b) by 247 days.

(21) Appl. No.: 13/973,052

(22) Filed: Aug. 22, 2013

(65) Prior Publication Data

US 2015/0053849 A1 Feb. 26, 2015

(51) Int. Cl.
*H01L 27/146* (2006.01)

(52) U.S. Cl.
CPC ........... *H01L 27/14618* (2013.01); *Y10T 29/53* (2015.01)

(58) Field of Classification Search
CPC .................................................. H01L 27/14618
USPC .................................. 250/226; 257/432–435
See application file for complete search history.

(56) References Cited

U.S. PATENT DOCUMENTS

| 7,789,575 B2 * | 9/2010 | Minamio | H01L 27/14618 |
| | | | 257/434 |
| 2012/0168888 A1 * | 7/2012 | Luan et al. | 257/432 |

* cited by examiner

*Primary Examiner* — Renee D Chavez
(74) *Attorney, Agent, or Firm* — Li & Cai Intellectual Property (USA) Office

(57) ABSTRACT

A sensor package structure includes a sensing die, a light-filtering sheet, and an annular pressure-sensitive adhesive sheet. An active surface of the sensing die has a sensing region and a connecting region around the sensing region. The periphery contour of sensing die is greater than or equal to the periphery contour of light-filtering sheet. The pressure-sensitive adhesive sheet has two opposite adhesive surfaces and defines an opening. The adhesive surfaces respectively adhere to the connecting region of the sensing die and the inner surface of the light-filtering sheet, and the sensing region faces the inner surface of the light-filtering sheet via the opening. The sensing region is sealed by the pressure-sensitive adhesive sheet and the light-filtering sheet. Thus, the instant disclosure provides the sensor package structure with low cost, high capacity, and high yield. Moreover, the instant disclosure provides a production apparatus for manufacturing the sensor package structure.

1 Claim, 9 Drawing Sheets

PRODUCTION APPARATUS FOR MANUFACTURING SENSOR PACKAGE STRUCTURE

BACKGROUND OF THE INVENTION

1. Field of the Invention

The instant disclosure relates to a package structure; more particularly, to a production apparatus for manufacturing a sensor package structure.

2. Description of Related Art

The conventional compact camera module (CCM) is almost produced by the chip scale package (CSP) process or the chip on board (COB) process. When the package structure is formed by the CSP process, a glass and a die are fixed to each other via an adhesive (e.g., epoxy resin or silicone). Specifically, after dripping the adhesive (e.g., epoxy resin or silicone) in-between the glass and the die, the adhesive needs a lot of time to solidify by baking. Thus, the die fixed on the glass by the CSP process needs to spend too much time to reduce the capacity of the package structure.

Moreover, the dripping step of the package structure is implemented by utilizing the dripping machine, and then combining the glass and the die with each other by pressing. However, during the said pressing, the adhesive (e.g., epoxy resin or silicone) is pressed to flow radially, and the flow of the adhesive cannot be controlled. Specifically, when the pressing distribution is not uniform, the glass easily has a tilt to the die for generating a package structure problem, which is the glass non-parallel to the die.

Additionally, when the package structure is formed by the COB process, the die is directly combined to the circuit board by wiring, and the package structure formed by the COB process does not have any glass to protect the die, so that the die has a particle pollution problem installing the package structure to the other components (e.g., lens). If the CCM adapts the package structure formed by the COB process, it needs to have a large scale clean room by investing a lot of money for resolving the particle pollution problem, which is generated from the installation of the package structure and the other components.

To achieve the abovementioned improvement, the inventors strive via industrial experience and academic research to present the instant disclosure, which can provide additional improvement as mentioned above.

SUMMARY OF THE INVENTION

One embodiment of the instant disclosure provides a sensor package structure and a production apparatus for manufacturing the sensor package structure, thereby reducing the cost of the sensor package structure and increasing the capacity and yield of the sensor package structure.

The sensor package structure disclosed in the instant disclosure comprises: a sensing die having an active surface, wherein the active surface has a sensing region and a connecting region surrounding around the sensing region; a light-filtering sheet having an inner surface and an opposite outer surface, wherein a periphery contour of the sensing die is greater than or equal to a periphery contour of the light-filtering sheet; and an annular pressure-sensitive adhesive sheet having two opposite adhesive surfaces and defining an opening, wherein the adhesive surfaces of the pressure-sensitive adhesive sheet are respectively pressed to seamlessly adhere to the connecting region of the sensing die and the inner surface of the light-filtering sheet, and the sensing region faces the inner surface of the light-filtering sheet via the opening; wherein the sensing region of the sensing die is sealed by the pressure-sensitive adhesive sheet and the light-filtering sheet.

The production apparatus disclosed in the instant disclosure for manufacturing the sensor package structure, comprises: a first workbench for carrying a plurality of light-filtering sheets, wherein an inner surface of each light-filtering sheet contacts the first workbench; a second workbench for carrying a plurality of pressure-sensitive adhesive sheets; a third workbench for carrying a plurality of sensing dies, wherein each sensing die has an active surface exposing from the third workbench; and a shifting member configured to move along the first, the second, and the third workbenches in sequence; wherein when the shifting member moves from the first workbench to the second workbench, the shifting member takes at least one light-filtering sheet to adhere to at least one pressure-sensitive adhesive sheet; when the shifting member moves from the second workbench to the third workbench, the shifting member takes the combination of the light-filtering sheet and the pressure-sensitive adhesive sheet to separate from the second workbench for adhering to at least one sensing die.

In summary, the sensor package structure utilizes the pressure-sensitive adhesive sheet to adhere to the sensing die and the light-filtering sheet for increasing the capacity of the sensor package structure. Moreover, the pressure-sensitive adhesive sheet is solid and has the constant thickness and shape, such that when using the pressure-sensitive adhesive sheet to adhere to the light-filtering sheet and the sensing die, the light-filtering sheet can easily keep parallel to the sensing die for increasing the yield of the sensor package structure. The sensing region of the sensing die of the instant disclosure is sealed by the pressure-sensitive adhesive sheet and the light-filtering sheet, so that the particle pollution problem does not exist during the sensor package structure installing to the other components (e.g., lens).

Additionally, the production apparatus disclosed in the instant disclosure is used for effectively reducing the producing time of the sensor package structure, and the production apparatus only needs a small scale clean room for receiving therein, thereby reducing the producing cost.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

[First Embodiment]

Figure 1:
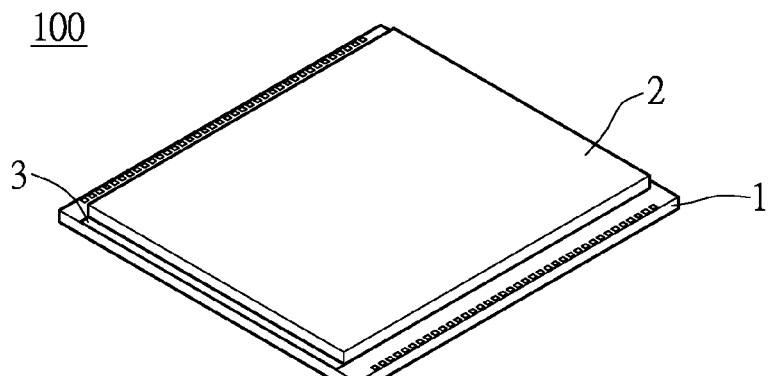
FIG. 1 is a perspective view of a sensor package structure according to the instant disclosure.
Figure 2:
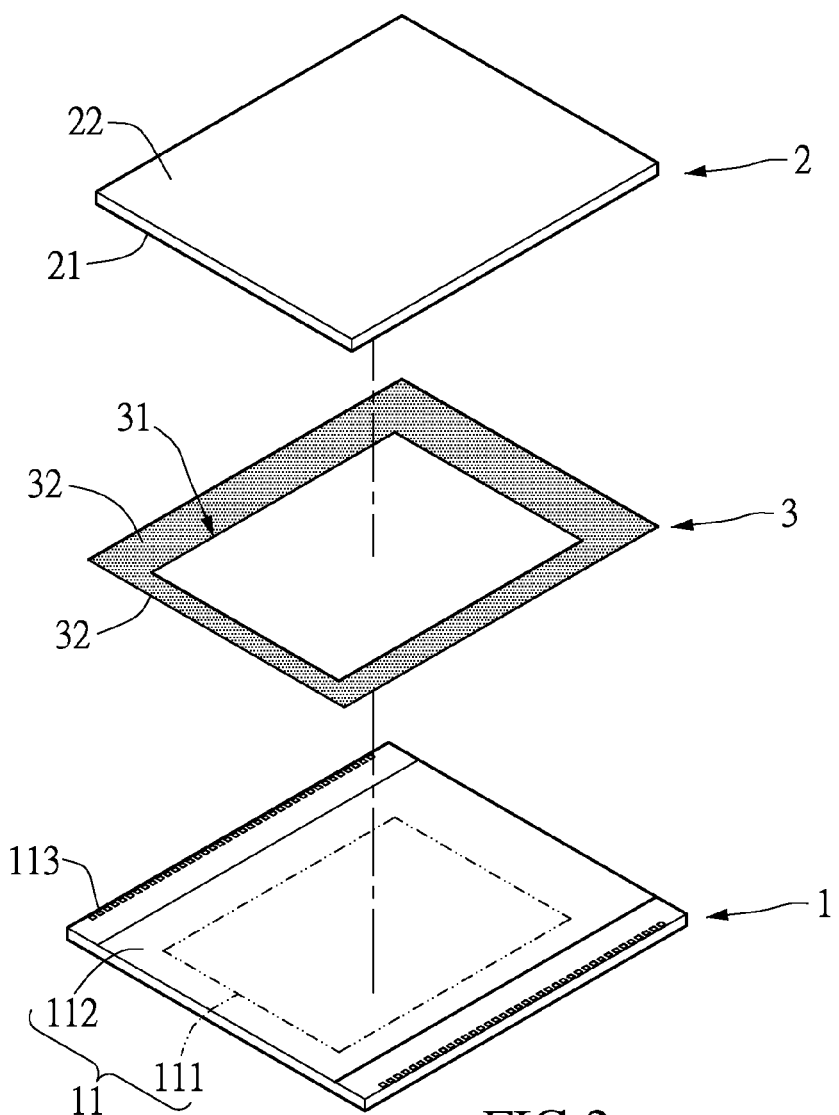
FIG. 2 is an exploded view of the sensor package structure according to the instant disclosure.
Figure 3:
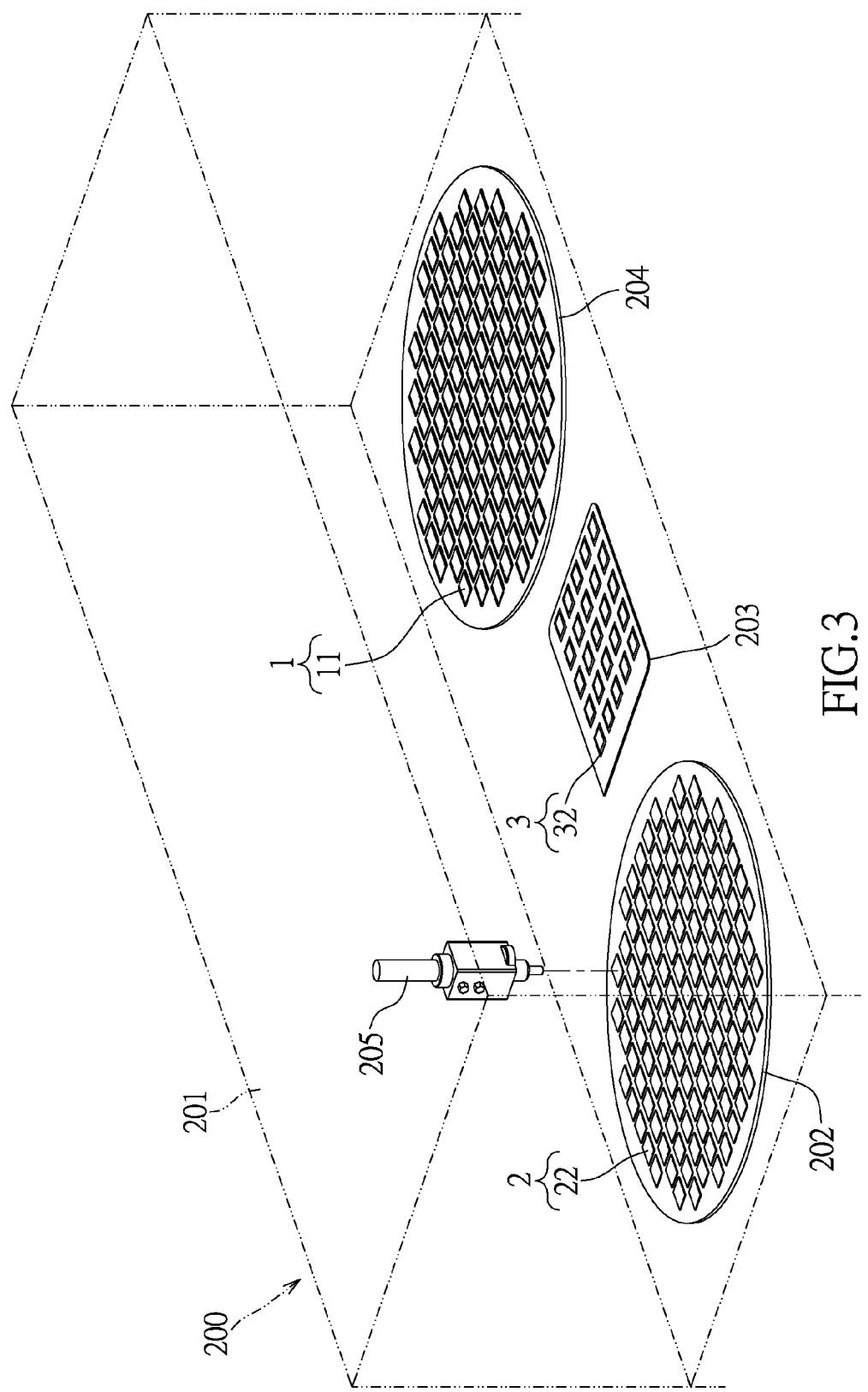
FIG. 3 is a perspective view of a first manufacturing process of the sensor package structure by a production apparatus according to the instant disclosure.
Figure 4:
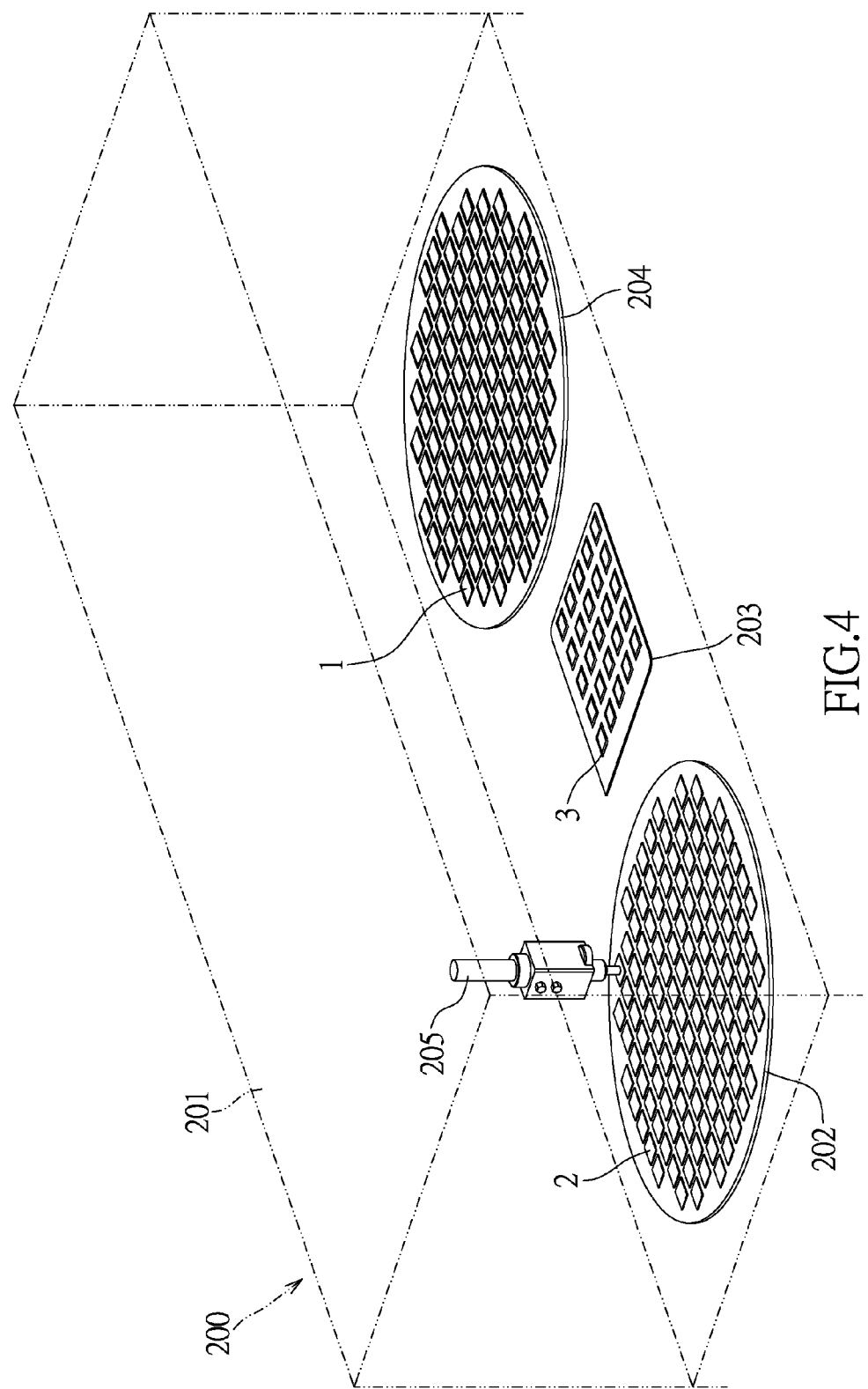
FIG. 4 is a perspective view of a second manufacturing process of the sensor package structure by the production apparatus according to the instant disclosure.
Figure 5:
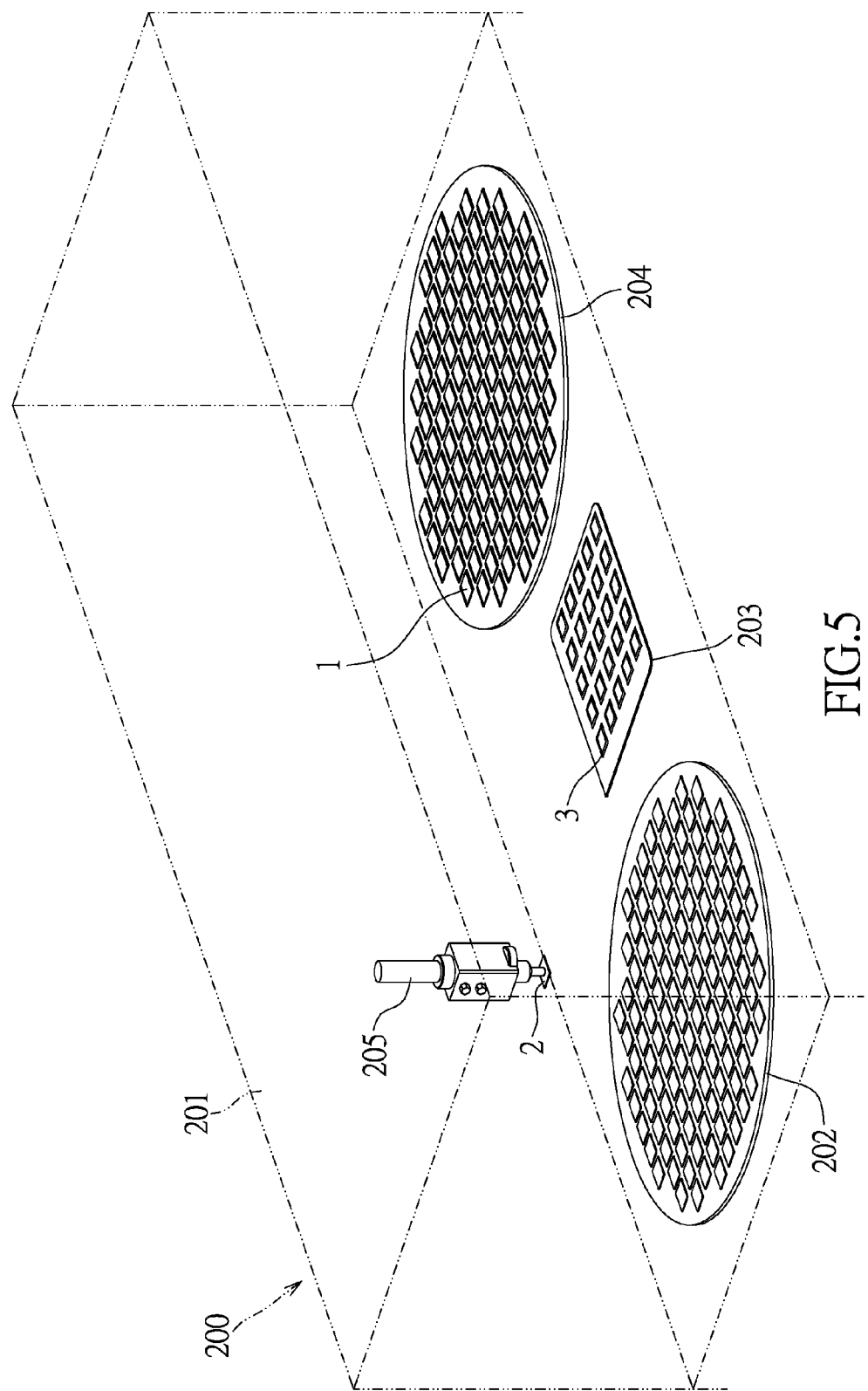
FIG. 5 is a perspective view of a third manufacturing process of the sensor package structure by the production apparatus according to the instant disclosure.
Figure 6:
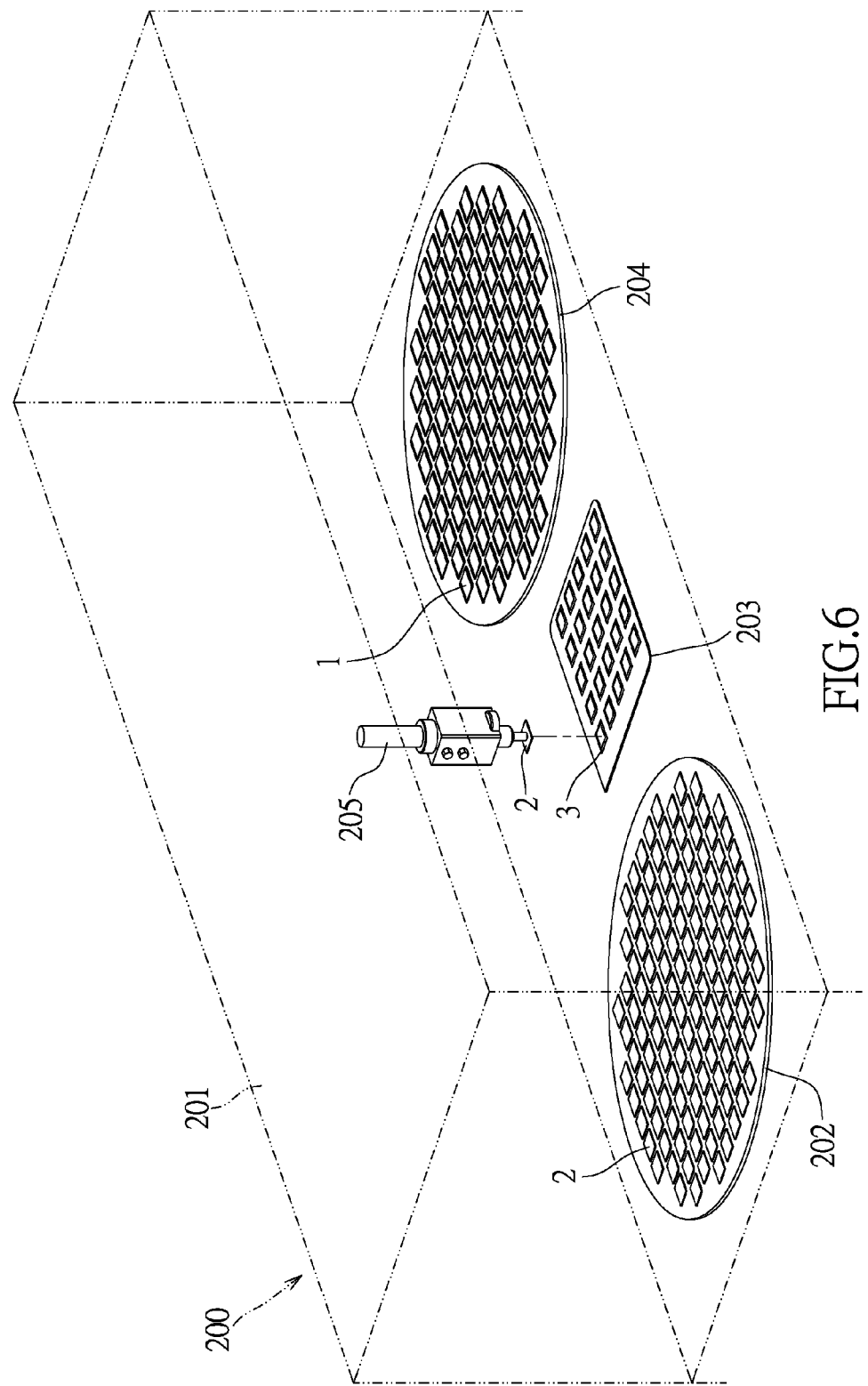
FIG. 6 is a perspective view of a fourth manufacturing process of the sensor package structure by the production apparatus according to the instant disclosure.
Figure 7:
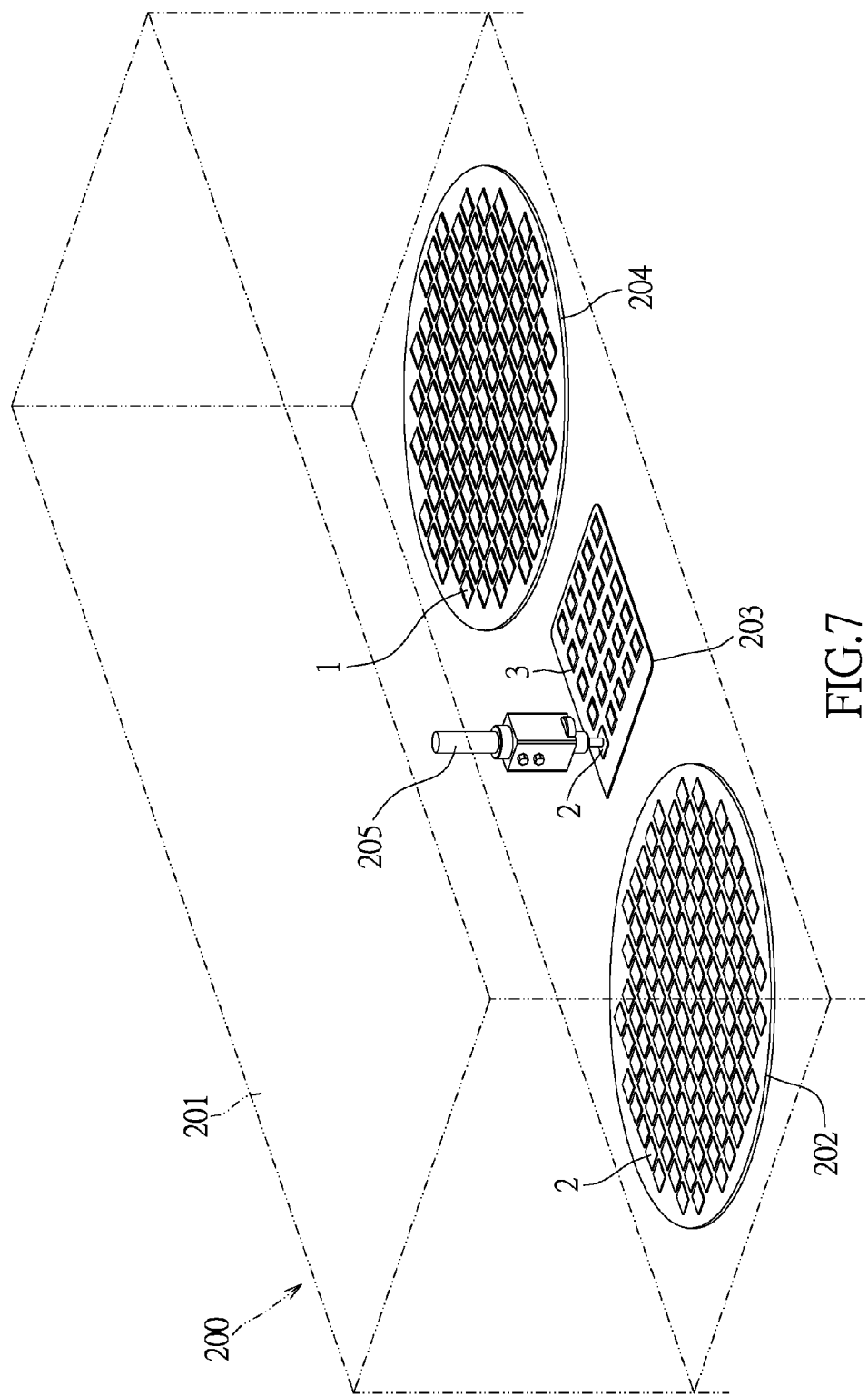
FIG. 7 is a perspective view of a fifth manufacturing process of the sensor package structure by the production apparatus according to the instant disclosure.
Figure 8:
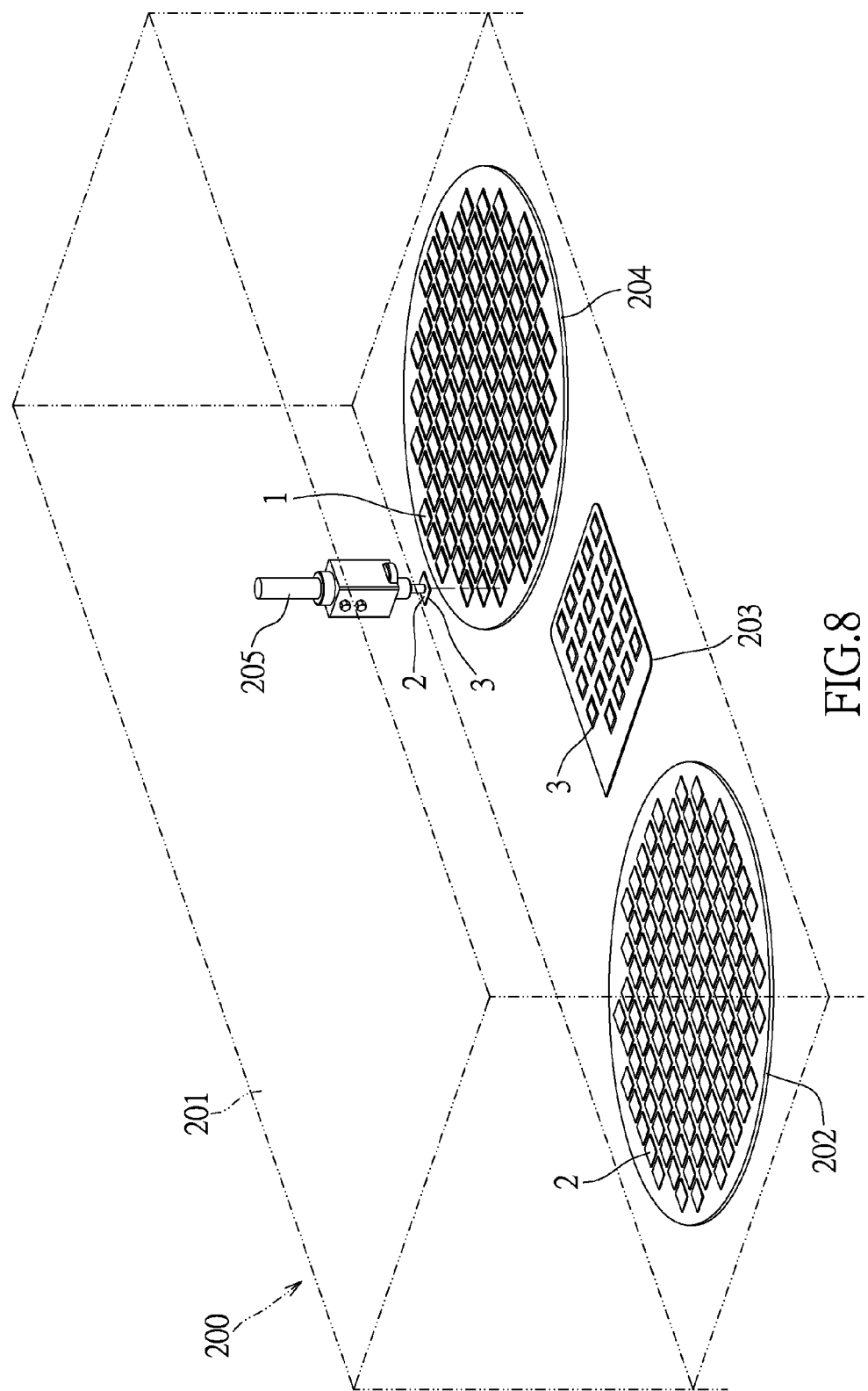
FIG. 8 is a perspective view of a sixth manufacturing process of the sensor package structure by the production apparatus according to the instant disclosure.
Figure 9:
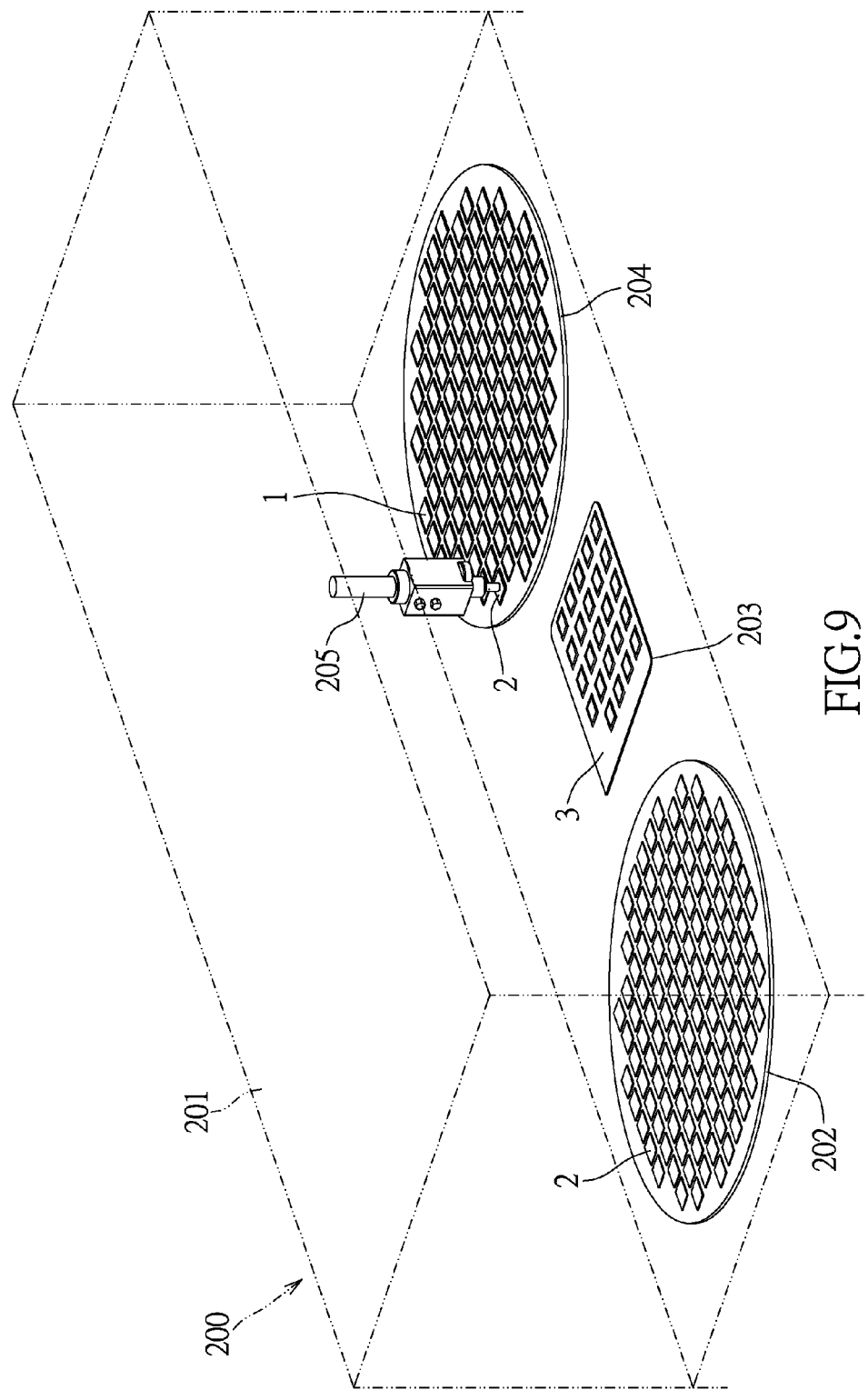
FIG. 9 is a perspective view of a seventh manufacturing process of the sensor package structure by the production apparatus according to the instant disclosure.
Figure 10:
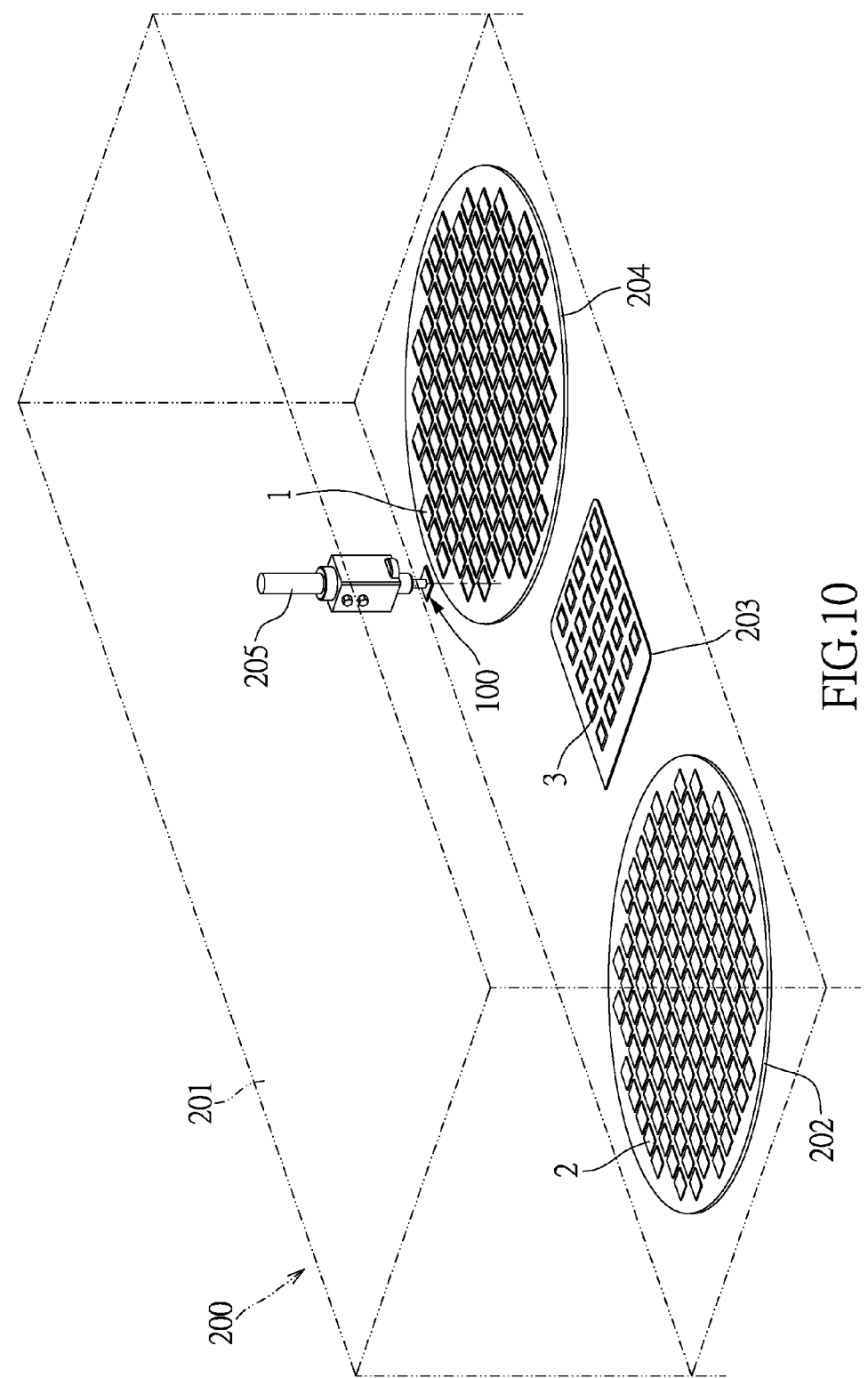
FIG. 10 is a perspective view of a eighth manufacturing process of the sensor package structure by the production apparatus according to the instant disclosure.

Please refer to FIGS. 1 and 2, which show a first embodiment of the instant disclosure. The instant embodiment provides a sensor package structure 100 including a sensing die 1, a light-filtering sheet 2, and a pressure-sensitive adhesive sheet 3, which has a rectangular annular shape. The following description discloses the detail construction of the sensing die 1, the light-filtering sheet 2, and the pressure-sensitive adhesive sheet 3 firstly, and then discloses the connecting relationship between the components of the sensor package structure 100.

The sensing die 1 in the instant embodiment takes a rectangular image sensing die for example. The sensing die 1 includes an active surface 11. The active surface 11 has a sensing region 111 and an annular connecting region 112 surrounding around the sensing region 111. The sensing die 1 includes a plurality of pads 113 respectively exposed from two opposite portions of the connecting region 112 (i.e., the upper-left portion and the lower-right portion of the connecting region 112 as shown in FIG. 2), where the pads 113 are arranged in two rows for being welded by the wiring process of the sensing die 1.

Moreover, the pads 113 in the instant embodiment are exposed form the active surface 11 for example, but the pads 113 can be exposed from a back surface, which is opposite to the active surface 11, for being welded by the surface mounting technology (SMT) process of the sensing die 1.

The light-filtering sheet 2 in the instant embodiment takes a rectangular infrared glass for example. The light-filtering sheet 2 has an inner surface 21 and an opposite outer surface 22. A periphery contour of the sensing die 1 is greater than or equal to a periphery contour of the light-filtering sheet 2. Specifically, the periphery contour of the sensing die 1 in the instant embodiment is greater than the periphery contour of the light-filtering sheet 2 for example, but is not limited thereto.

The pressure-sensitive adhesive sheet 3 is a solid element, and a thickness of the pressure-sensitive adhesive sheet 3 is constant without solidification by heating. The pressure-sensitive adhesive sheet 3 defines a rectangular opening 31 arranged at a substantially center portion thereof. The opening 31 of the pressure-sensitive adhesive sheet 3 (i.e., the internal edge of the pressure-sensitive adhesive sheet 3) is greater than or equal to a periphery contour of the sensing region 111 of the sensing die 1. The periphery contour of the sensing die 1 is approximately greater than or equal to a periphery contour of the pressure-sensitive adhesive sheet 3. Specifically, in the instant embodiment, the opening 31 of the pressure-sensitive adhesive sheet 3 is greater than the periphery contour of the sensing region 111 of the sensing die 1, and the periphery contour of the sensing die 1 is approximately greater than the periphery contour of the pressure-sensitive adhesive sheet 3.

Moreover, when the pads 113 are exposed from the back surface of the sensing die 1 (not shown), the opening 31 of the pressure-sensitive adhesive sheet 3 can be equal to the periphery contour of the sensing region 111 of the sensing die 1, and the periphery contour of the sensing die 1 can be equal to the periphery contour of the pressure-sensitive adhesive sheet 3, such that the volume of the sensor package structure 1 can be reduced.

The pressure-sensitive adhesive sheet 3 has two opposite adhesive surfaces 32 (i.e., the top surface and the bottom surface of the pressure-sensitive adhesive sheet 3 as shown in FIG. 2). The adhesive surfaces 32 of the pressure-sensitive adhesive sheet 3 are parallel to each other. One of the adhesive surfaces 32 of the pressure-sensitive adhesive sheet 3 is used for adhering to the inner surface 21 of the light-filtering sheet 2 by press of the inner surface 21 of the light-filtering sheet 2, and another adhesive surface 32 is used for adhering to the connecting region 112 of the sensing die 1 by pressing the connecting region 112 of the sensing die 1.

Moreover, before the pressure-sensitive adhesive sheet 3 adhering to the light-filtering sheet 2 and the sensing die 1, a plurality of pressure-sensitive adhesive sheets 3 are detachably adhered between-in a top release film and a middle release film. A backing adhesive (e.g., removable sticker) is formed on a surface of the middle release film without connecting to the pressure-sensitive adhesive sheets 3, and the backing adhesive is adhered to a bottom lease film. In other words, one of the adhesive surfaces 32 of each pressure-sensitive adhesive sheet 3 is detachably adhered to the top lease film, and another adhesive surface 32 of each pressure-sensitive adhesive sheet 3 is detachably adhered to the middle lease film. The top release film, the pressure-sensitive adhesive sheets 3, the middle release film, the backing adhesive, and the bottom release film are jointly defined as an adhesive module.

The detail construction of the sensing die 1, the light-filtering sheet 2, and the pressure-sensitive adhesive sheet 3 are disclosed, and then the following description discloses the connecting relationship between the components of the sensor package structure 100.

The adhesive surfaces 32 of the pressure-sensitive adhesive sheet 3 are respectively pressed to seamlessly adhere to the connecting region 112 of the sensing die 1 and the periphery portion of the inner surface 21 of the light-filtering sheet 2, and the sensing region 111 faces the substantial center portion of the inner surface 21 of the light-filtering sheet 2 via the opening 31. Specifically, the pressure-sensitive adhesive sheet 3 is approximately arranged in an area defined by the light-filtering sheet 2 orthogonally projecting to the active surface 11 of the sensing die 1. The pads 113 are arranged outside a portion of the connecting region 112, which is combined with the pressure-sensitive adhesive sheet 3.

The active surface 11 of the sensing die 1 is parallel to the inner surface 21 of the light-filtering sheet 2 by the adhesive surfaces 32 of the pressure-sensitive adhesive sheet 3 parallel to each other. The sensing region 111 of the sensing die 1 is sealed by the pressure-sensitive adhesive sheet 3 and the light-filtering sheet 2.

Base on the above, the sensor package structure 100 in the instant embodiment may have some advances with respect to the conventional package structure manufactured by the CSP process and the COB process. The advances of the sensor package structure 100 are stated as follows.

When the sensor package structure 100 compares to the conventional package structure manufactured by the CSP process, the sensor package structure 100 in the instant embodiment has a adjustable adhesive force by pressing the pressure-sensitive adhesive sheet 3 to adhere to the light-filtering sheet 2 and the sensing die 1. In other words, the pressure-sensitive adhesive sheet 3 does not need to be heated for solidifying, such that the producing time of the sensor package structure 100 is reduced for increasing the capacity of the sensor package structure 100. Moreover, the sensor package structure 100 in the instant embodiment uses the solid pressure-sensitive adhesive sheet 3, which has the constant thickness and shape, to adhere to the light-filtering sheet 2 and the sensing die 1, so that the light-filtering sheet 2 easily keeps parallel to the sensing die 1 for increasing the yield of the sensor package structure 100.

Additionally, when the sensor package structure 100 compares to the conventional package structure manufactured by the COB process, the sensor package structure 100 in the instant embodiment uses the pressure-sensitive adhesive sheet 3 to adhere to the light-filtering sheet 2 and the sensing die 1, and seals the sensing region 111 of the sensing die 1 by the pressure-sensitive adhesive sheet 3 and the light-filtering sheet 2, so that the particle pollution problem, which is generated from assembling the sensor package structure 100 to the other components (e.g., lens), can be prevented.

[Second Embodiment]

Please refer to FIGS. 3 through 10, which show a second embodiment of the instant disclosure. The second embodiment provides a production apparatus 200 used for manufacturing the sensor package structure 100 disclosed in the first embodiment. The sensor package structure 100 has been disclosed in the first embodiment, so that the instant embodiment does not state the construction of the sensor package structure 100 again.

The production apparatus 200 includes a machine body 201, a first workbench 202, a second workbench 203, a third workbench 204, and a shifting member 205. The first workbench 202, the second workbench 203, the third workbench 204, and the shifting member 205 are installed on the machine body 201, and the machine body 201 includes a driving module (not shown) for providing the three dimensional movement of the shifting member 205. The driving module is a conventional feature, so the instant embodiment does not state in detail.

The function of each component of the production apparatus 200 is disclosed as follows. The first workbench 202 is used for carrying a plurality of light-filtering sheets 2, in which the inner surface 21 of each light-filtering sheet 2 contacts the first workbench 202. The second workbench 203 is used for carrying a plurality of pressure-sensitive adhesive sheets 3. The third workbench 204 is used for carrying a plurality of sensing dies 1, in which each sensing die 1 has an active surface 11 exposing from the third workbench 204.

Moreover, the shifting member 205 in the instant embodiment takes the vacuum adsorption type for example, but the type of the shifting member 205 is not limited thereto. The shifting member 205 is configured to move along the first, the second, and the third workbenches 202, 203, 204 in sequence. When the shifting member 205 moves from the first workbench 202 to the second workbench 203, the shifting member 205 takes at least one light-filtering sheet 2 to adhere to at least one pressure-sensitive adhesive sheet 3. When the shifting member 205 moves from the second workbench 203 to the third workbench 204, the shifting member 205 takes the combination of the light-filtering sheet 2 and the pressure-sensitive adhesive sheet 3 to separate from the second workbench 203 for adhering to at least one sensing die 1

Specifically, please refer to FIGS. 3 through 10, and with reference occasionally made to FIGS. 1 and 2. When the production apparatus 200 is used to assembly the sensor package structure 100, the steps are disclosed as follows.

Step S101: disposing a plurality of light-filtering sheets 2 on the first workbench 202, and the outer surface 22 of each light-filtering sheet 2 faces upwardly for exposing; disposing a plurality of pressure-sensitive adhesive sheets 3 on the second workbench 203; disposing a plurality of sensing dies 1 on the third workbench 204, and the active surface 11 of each sensing die 1 faces upwardly for exposing. Specifically, in the disposing process of the pressure-sensitive adhesive sheets 3, the bottom lease film of the adhesive module is removed to take the backing adhesive on the second workbench 203, and then removing the top lease film.

Step S102: the shifting member 205 sucks a predetermined light-filtering sheet 2 of the light-filtering sheets 2 disposed on the first workbench 202, and then carries the predetermined light-filtering sheet 2 to locate above a predetermined pressure-sensitive adhesive sheet 3 of the pressure-sensitive adhesive sheets 3 disposed on the second workbench 203.

Step S103: the shifting member 205 carries the predetermined light-filtering sheet 2 to adhere to the predetermined pressure-sensitive adhesive sheet 3 by pressing the inner surface 21 of the predetermined light-filtering sheet 2 on the adhesive surface 32 of the predetermined pressure-sensitive adhesive sheet 3. Moreover, the said pressing force of the inner surface 21 must be enough to generate an adhesive force between the predetermined light-filtering sheet 2 and the predetermined pressure-sensitive adhesive sheet 3 greater than an adhesive force between the predetermined pressure-sensitive adhesive sheet 3 and the middle release film.

Step S104: the shifting member 205 carries the predetermined light-filtering sheet 2 and the predetermined pressure-sensitive adhesive sheet 3 to locate above a predetermined sensing die 1 of the sensing dies 1 disposed on the third workbench 204. Specifically, when the shifting member 205 carries the predetermined light-filtering sheet 2 and the predetermined pressure-sensitive adhesive sheet 3 to move, the predetermined pressure-sensitive adhesive sheet 3 is separated from the middle release film by the adhesive force between the predetermined light-filtering sheet 2 and the predetermined pressure-sensitive adhesive sheet 3 greater than the adhesive force between the predetermined pressure-sensitive adhesive sheet 3 and the middle release film.

Step S105: the shifting member 205 carries the predetermined light-filtering sheet 2 and the predetermined pressure-sensitive adhesive sheet 3 to adhere to the predetermined sensing die 1 by using the adhesive surface 32 of the predetermined pressure-sensitive adhesive sheet 3, which align the predetermined sensing die 1, to press on the connecting region 112 of the predetermined sensing die 1. After that, the adhered structure of the predetermined light-filtering sheet 2, the predetermined pressure-sensitive adhesive sheet 3, and the predetermined sensing die 1 is a sensor package structure 100.

Base on the above, the production apparatus 200 disclosed in the instant embodiment can be used for effectively reducing the producing time of the sensor package structure 100 by taking the pressure-sensitive adhesive sheet 3 to respectively adhere to the light-filtering sheet 2 and the sensing die 1. Moreover, the manufacturing company only needs to provide a small scale clean room for receiving the production apparatus 200, such that the cost for resolving the particle pollution problem is reduced.

Additionally, the figures of the instant embodiment takes the shifting member 205 to suck one component (i.e., the predetermined light-filtering sheet 2) for example, but in another non-shown embodiment, the shifting member 205 can be designed to simultaneously carry a plurality of components for further increasing the capacity of the sensor package structure 100.

[The Possible Effect Of The Instant Disclosure]

In summary, when the sensor package structure of the instant disclosure compares to the conventional package structure formed by the CSP process, the pressure-sensitive adhesive sheet of the instant disclosure can be pressed to immediately generate an adhesive force for adhering to the sensing die and the light-filtering sheet, thereby reducing the producing time and increasing the capacity of the sensor package structure. Moreover, the pressure-sensitive adhesive sheet is solid and has the constant thickness and shape, such that when using the pressure-sensitive adhesive sheet to adhere to the light-filtering sheet and the sensing die, the light-filtering sheet can easily keep parallel to the sensing die for increasing the yield of the sensor package structure.

Additionally, this paragraph discloses the sensor package structure of the instant disclosure comparing to the conventional package structure formed by the COB process. The sensing region of the sensing die of the instant disclosure is sealed by the pressure-sensitive adhesive sheet and the light-filtering sheet, so that the particle pollution problem does not exist during the sensor package structure installing to the other components (e.g., lens).

The production apparatus disclosed in the instant disclosure is used for effectively reducing the producing time of the sensor package structure, and the production apparatus only needs a small scale clean room for receiving therein, thereby reducing the producing cost.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A production apparatus for manufacturing a sensor package structure, comprising:

a first workbench for carrying a plurality of light-filtering sheets, wherein an inner surface of each light-filtering sheet contacts the first workbench;

a second workbench for carrying a plurality of pressure-sensitive adhesive sheets;

a third workbench for carrying a plurality of sensing dies, wherein each sensing die has an active surface exposing from the third workbench; and a shifting member configured to move along the first, second, third workbenches in sequence; wherein when the shifting member moves from the first workbench to the second workbench, the shifting member takes at least one light-filtering sheet to adhere to at least one pressure-sensitive adhesive sheet; when the shifting member moves from the second workbench to the third workbench, the shifting member takes the combination of the light-filtering sheet and the pressure-sensitive adhesive sheet to separate from the second workbench for adhering to at least one sensing die, thereby manufacturing a sensor package structure;

wherein the sensor package structure comprises:

a sensing die having an active surface, wherein the active surface has a sensing region and a connecting region surrounding around the sensing region;

a light-filtering sheet having an inner surface and an opposite outer surface, wherein a periphery contour of the sensing die is greater than or equal to a periphery contour of the light-filtering sheet; and an annular pressure-sensitive adhesive sheet having two opposite adhesive surfaces and defining an opening, wherein the adhesive surfaces of the pressure-sensitive adhesive sheet are respectively pressed to seamlessly adhere to the connecting region of the sensing die and the inner surface of the light-filtering sheet, and the sensing region faces the inner surface of the light-filtering sheet via the opening;

wherein the sensing region of the sensing die is sealed by the pressure-sensitive adhesive sheet and the light-filtering sheet.

\* \* \* \* \*